United States Patent
Liu et al.

(10) Patent No.: US 6,841,830 B2
(45) Date of Patent: Jan. 11, 2005

(54) METAL OXIDE SEMICONDUCTOR FIELD EFFECT TRANSISTORS (MOSFETS) USED IN INK-JET HEAD CHIPS AND METHOD FOR MAKING THE SAME

(75) Inventors: Chien-Hung Liu, Hsinchu Hsien (TW); Jian-Chiun Liou, Hsinchu Hsien (TW); Chun-Jung Chen, Hsinchu Hsien (TW); Je-Ping Hu, Hsinchu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/627,637

(22) Filed: Jul. 28, 2003

(65) Prior Publication Data

US 2004/0124449 A1 Jul. 1, 2004

(30) Foreign Application Priority Data

Dec. 31, 2002 (TW) .................................. 91138067 A

(51) Int. Cl.⁷ .................. H01L 29/76; G01R 19/00
(52) U.S. Cl. .................. 257/368; 257/327; 257/650; 257/751; 257/382; 347/57; 347/59; 347/61
(58) Field of Search .................. 257/368, 327, 257/650, 751, 382–384; 347/57–59, 61

(56) References Cited

U.S. PATENT DOCUMENTS

| 6,102,528 A | * | 8/2000 | Burke et al. .................. 347/59 |
| 6,666,545 B2 | * | 12/2003 | Liu et al. .................. 347/58 |
| 2004/0124449 A1 | * | 7/2004 | Liu et al. .................. 257/288 |

* cited by examiner

*Primary Examiner*—Mark V. Prenty
(74) *Attorney, Agent, or Firm*—Birch, Stewart, Kolasch & Birch, LLP

(57) ABSTRACT

A MOSFET and the method for fabricating them are disclosed to make the inkjet head chips. The MOSFET has the scaled-down junction formation for the source and drain. Using a lower temperature process and interlayer dielectric, the source and drain dopants can not be diffused deeply due to high-temperature driver-in. The contact holes of the drain are provided with plugs of refractory material to avoid spiking between the metal and silicon. This achieves the requirement of high-density devices on the print head chip.

12 Claims, 3 Drawing Sheets

METAL OXIDE SEMICONDUCTOR FIELD EFFECT TRANSISTORS (MOSFETS) USED IN INK-JET HEAD CHIPS AND METHOD FOR MAKING THE SAME

BACKGROUND OF THE INVENTION

1. Field of Invention

The invention relates to a MOSFET and the method for manufacturing them. In particular, it relates to a MOSFET for ink-jet heads and the associated manufacturing method.

2. Related Art

The inkjet printer ejects ink droplets on a printing medium to form desired texts or pictures. The size, shape, material, density, and positioning of the produced ink droplets are important factors that will affect the printing quality. The smaller the ink droplet size is, the higher printing resolution one can achieve. However, under normal conditions, the printing speed is also sacrificed. In order to promote the printing speed and resolution, the number of nozzles on the print head chip is the substantial solution.

To achieve this objective, driving devices with switch and active characteristics such as transistors and the ink droplet actuators are often integrated into a single inkjet print head chip. The number of cartridge contact points X and the number of nozzles Y are promoted from the one-to-one driving mode (X=Y) to one-to-many mode $(Y=(X/2)^2)$. Such integrated driver head (e.g. ejecting ink droplets using thermal bubbles) is normally made by connecting a metal oxide semiconductor field effect transistor (MOSFET) with a droplet actuating thermal resistor in series. A sufficiently high driving current has to pass through the MOSFET at a voltage around 10V for the thermal bubble actuator to obtain enough energy to generate bubbles that eject ink droplets out. Since the MOSFET used in the inkjet print head chip is used under large currents and voltages, it is commonly to use with phosphosilicate glass (PSG) for the 1st interlayer dielectric. The temperature is raised to be higher than 1000° C. to drive the phosphor within the PSG into silicon, forming the N+ diffusion of source and drain with deep junctions. The junction depth is about 1.2 $\mu$m to 1.8 $\mu$m. In addition to avoiding the spiking at the Al—Si contact surface, the N+ diffusion with deep junction can increase the breakdown voltage of the MOSFET. With the increase of the printing speed and resolution, using tiny ink droplets and increasing the inkjet frequency have become the primary objectives. Consequently, the energy required to form each individual ink droplet gets lower. The needed current and voltage also decreases accordingly. At the same time, the line width required by the MOSFET is made thinner to increase the device density on a chip. In summary, these requirements of inkjet print head chips have made the existing driving device structure and specification are not satisfactory.

SUMMARY OF THE INVENTION

To make MOSFET's that satisfy high package density requirements for the inkjet print head chips, the invention provides a MOSFET used in ink-jet head chips and the corresponding manufacturing method. A silicon substrate is formed with a source and a drain with a shallower doped junction depth. A process in lower temperature is used to achieve the requirements for making print head chips with a high device density.

To achieve the above objective, the disclosed MOSFET contains an active region and a body-contact active region on the silicon substrate. A gate insulator is grown across the active region. Polysilicon is then deposited on the insulating layer to form the gate of the MOSFET. A source and a drain are the defined in the active region by diffusion or ion implantation. The active region and the gate are partially covered by borophosphosilicate glass (BPSG), which is formed with a reflow treatment. Places on the BPSG that corresponding to the source and the drain are formed with contact holes, filled with a plug material to prevent the spiking of the contact between aluminum and silicon at the drain during subsequent processes. To increase the device density, the gate length is between 0.35 $\mu$m and 3.5 $\mu$m. The depth sum of the junction at the source and the drain is 0.2 to 0.75 times the gate length.

The chip of the integrated-driver head is formed by combining the above-mentioned MOSFET device, an actuator, and an ink-flow structure. The MOSFET device is in electrical communications with the actuator. The voltage on the gate controls the current flowing through the actuator. The ink-flow structure contains ink channels, ink-firing chambers and nozzles that allow ink to pass through. The actuator is connected with the ink-flow structure to provide the energy for ink to be ejected out of the nozzles.

More explicitly, the disclosed method for making MOSFET's used in the printhead with high-density devices contains the steps of: defining in order an active region and a gate on the silicon substrate, with the gate length ranging from 0.35 $\mu$m to 3.5 $\mu$m; doping impurities on both sides of the gate to form a drain and a source, with the junction depth of the drain dopant being 0.1 to 0.6 times the gate length; and covering the active region and the gate with reflowed BPSG, which has contact holes filled with a plug material at the drain positions.

Said BPSG has a thickness ranging from 150 nm to 1000 nm, a boron content between 0.5 wt % and 6.0 wt %, and a reflow temperature between 850° C. and 925° C. The plug material has a thickness between 0.01 $\mu$m and 1.0 $\mu$m, and a material selected from the group consisting of W, Pt, Ti, Co, Ni, Mo, Ta, Si, and their alloys or compounds.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
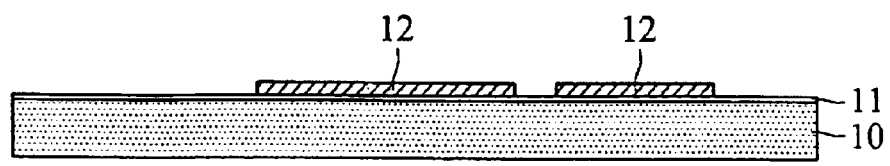
FIGS. 1 to 4, 5A, 5B, 6 and 7 are the manufacturing flowcharts in an embodiment of the invention.
Figure 2:
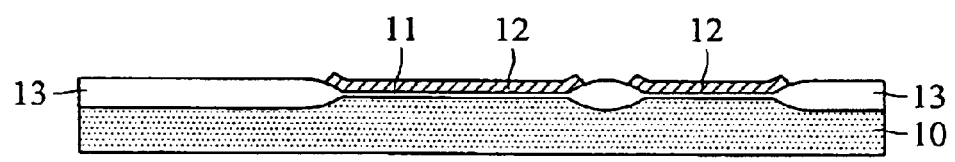
Figure 3:
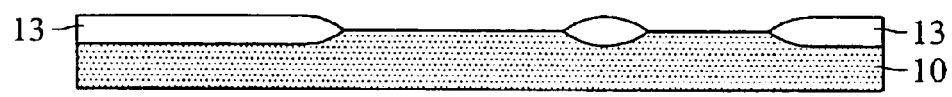

With reference to FIGS. 1 to 7, we use the n-channel metal oxide semiconductor field effect transistor (nMOSFET) as an example to explain the procedure of an embodiment of the invention. First, a silicon substrate is performed with the process of local oxidation of silicon (LOCOS), forming a field oxide (FOX) and defining out an active region and a body-contact active region. As shown in FIG. 1, the silicon substrate 10 is oxidized to form a stress buffer oxide 11. It is further deposited with a silicon nitride 12 using the chemical vapor deposition (CVD) method. After lithography and etching steps, the active region and the body-contact active region are defined on the silicon nitride 12. As shown in FIG. 2, a thick FOX 13 is subsequently formed using high-temperature wet oxidation. Finally, the stress buffer oxide 11 and the silicon nitride 12 are removed, forming the structure in FIG. 3.

Figure 4:
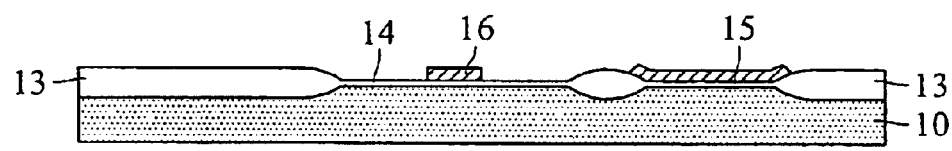

Secondly, the gate is defined and the active region is doped to form a drain and a source. For different threshold voltages, a screen oxide is first formed and implanted with boron as the threshold voltage implantation. Afterwards, the screen oxide is removed. As shown in FIG. 4, a gate oxide 14 with a thickness range from 10 nm to 75 nm is formed by oxidation at high temperatures and then deposited with polysilicon to form a gate. Finally, a polysilicon gate 16 is defined by lithography and etching. The gate 16 has a thickness range from 0.1 $\mu$m to 0.4 $\mu$m and a length L range from 0.35 $\mu$m to 3.5 $\mu$m.

Figure 5A:
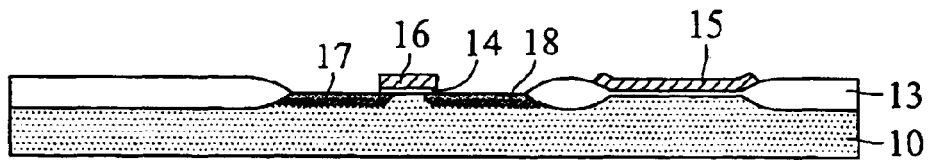
Figure 5B:
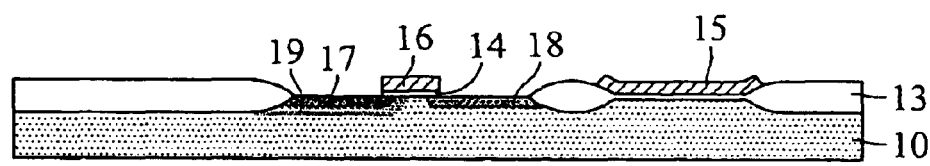

The next step is doping the source 18 and the drain 17. As shown in FIG. 5A, phosphor (P) or phosphide is doped on both sides of the gate 16 by ion implantation or diffusion to form an n-doped junction as a drain 17 and a source 18. The dopant depth is 0.1 to 0.35 that of the gate length. If the shallow junction is needed, arsenic (As) or arsenide may be used as the dopant. One may also choose to use As, P and their compounds simultaneously to form an n-doped junction. Moreover, to increase the drain breakdown voltage and to reduce n-doped encroaching under gate, the drain can be doped with drain-side-only phosphor dopant to form a deeper but low-concentration n$^-$-doped junction 19, as shown in FIG. 5B. The next step is to dope the drain 17 and the source 18 to be a shallower but high-concentration n$^+$-doped junction. The goal is to have the doped junction depth of the drain 17 greater than the junction depth of the source 18. The depth of the n$^-$-doped junction 19 of the drain 17 is about 0.1 to 0.6 times the gate length. The final doped junction depth sum of the source 18 and the drain 17 is 0.2 to 0.75 times the gate length.

Figure 6:
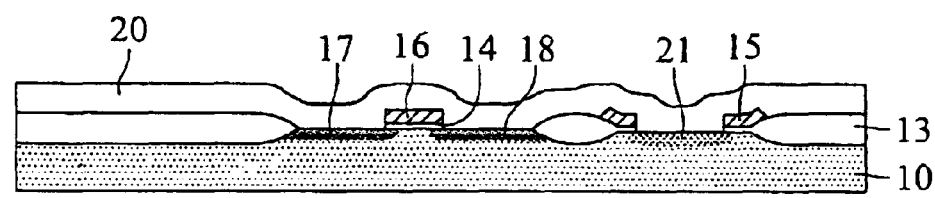

After doping the source 18 and the drain 17, the body-contact active region is defined with a base doping region 21 to perform p-type doping (see FIG. 6). The first step is to deposit a low-temperature undoped silicon oxide (LTO, not shown), followed by depositing BPSG on its surface. The BPSG is reflowed as a first interlayer dielectric layer 20. The thickness range of undoped LTD is from 20 nm to 250 nm; the thickness range of the BPSG is from 100 nm to 1000 nm.

Figure 7:
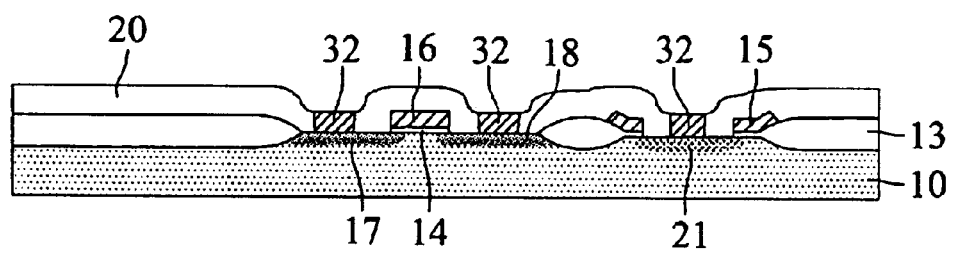

The reflow-temperature range of the BPSG is from 850° C. to 925° C. The lower reflow temperature can prevent too deeper dopant drived-in at the source 18 and the drain 17. As shown in FIG. 7, contact holes are formed at the drain 17, the source 18 and the body-contact 21. If the MOSFET has shallower source and drain junctions, the plug material 32 filling the contact holes can prevent the spiking between aluminum and silicon at the source and the drain.

Figure 8:
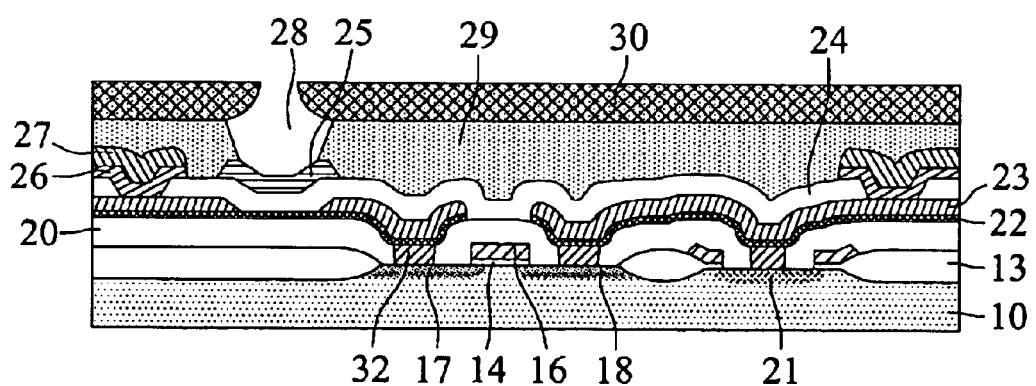
FIG. 8 is a schematic view of the chip in the disclosed integrated drive head.

The disclosed integrated-driver head chip has a structure formed using the above-mentioned MOSFET. With reference to FIG. 8, a thermal-resistor layer 22 and a first conductive layer 23 is formed and defined upon the substrate. They are then covered by an insulating layer 24 and a passivation layer 25. The insulating layer 24 has some via 31 connecting to the first conductive layer 23 for providing electrical connect between the first conductive layer 23 and a second conductive layer 27. One can form an intermetal barrier 26 under the second conductive layer by evaporation or sputter. The intermetal barrier 26 can enhance the adhesion of the contact points between the chip and the circuit board. Finally, a thick photo resist 29 is used to define the ink-flow channels and the ink firing chamber 28. The ink-flow architecture is completed after bonding with a nozzle plate 30.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A metal oxide semiconductor field effect transistor (MOSFET) used in ink-jet head chips, which is connected to an inkjet actuator for controlling the electrical voltage or current passing through the inkjet actuator; the MOSFET comprising at least a source, a drain, and a gate and being characterized in that: the MOSFET is covered with a borophosphosilicate glass (BPSG); at least one contact hole through the BPSG is filled with a plug material at the position corresponding to the drain; the gate length is between 0.35 $\mu$m and 3.5 $\mu$m, and the sum of junction depths at the source and the drain is 0.2 to 0.75 times that of the gate length.

2. The metal oxide semiconductor field effect transistor of claim 1, wherein the BPSG has a thickness between 150 nm and 1000 nm.

3. The metal oxide semiconductor field effect transistor of claim 1, wherein the BPSG has a boron content between 0.5 wt % and 6.0 wt %.

4. The metal oxide semiconductor field effect transistor of claim 1, wherein the BPSG has a reflow temperature between 850° C. and 925° C.

5. The metal oxide semiconductor field effect transistor of claim 1, wherein the plug material has a thickness between 0.01 $\mu$m and 1.0 $\mu$m.

6. The metal oxide semiconductor field effect transistor of claim 1, wherein the plug material is one selected from the group consisting of W, Pt, Ti, Co, Ni, Mo, Ta, Si, and their alloys and compounds.

7. A chip structure of an integrated-driver ink-jet head, comprising:

a plurality of MOSFETs, which contains at least one gate, a source, and a drain, wherein the MOSFET is covered with a borophosphosilicate glass (BPSG); at least one contact hole through the BPSG is filled with a plug material at the position corresponding to the drain; the gate length is between 0.35 µm and 3.51 µm, and the sum of junction depths at the source and the drain is 0.2 to 0.75 times that of the gate length;

a plurality of actuators, which are in electrical communications with the MOSFETs for providing the energy to eject fluid out; and a plurality of fluid-flow structures, which define at least one fluid-flow channel on an fluid-chamber and a nozzle for the fluid to refill and are in communications with said actuators to eject fluid out.

8. The chip structure of claim 7, wherein the BPSG has a thickness between 150 nm and 1000 nm.

9. The chip structure of claim 7, wherein the BPSG has a boron content between 0.5 wt % and 6.0 wt %.

10. The chip structure of claim 7, wherein the BPSG has a reflow temperature between 850° C. and 925° C.

11. The chip structure of claim 7, wherein the plug material has a thickness between 0.1 µm and 1.0 µm.

12. The chip structure of claim 7, wherein the plug material is at least one selected from the group consisting of W, Pt, Ti, Co, Ni, Mo, Ta, Si, and their alloys and compounds.

* * * * *